United States Patent
Brunschwiler et al.

(10) Patent No.: US 10,170,445 B2
(45) Date of Patent: Jan. 1, 2019

(54) METHOD FOR ELECTRICAL COUPLING AND ELECTRIC COUPLING ARRANGEMENT

(71) Applicants: INTERNATIONAL BUSINESS MACHINES CORPORATION, Armonk, NY (US); Intrinsiq Materials Ltd., London (GB); Technische Universitaet Chemnitz, Chemnitz (DE); SINTEF, Trondheim (NO)

(72) Inventors: Thomas J. Brunschwiler, Rueschlikon (CH); Richard Dixon, London (GB); Maaike M. Visser Taklo, Oslo (NO); Bernhard Wunderle, Chemnitz (DE); Kerry Yu, London (GB); Jonas Zuercher, Rueschlikon (CH)

(73) Assignees: INTERNATIONAL BUSINESS MACHINES CORPORATION, Armonk, NY (US); TECHNISCHE UNIVERSITAET CHEMNITZ, Chemnitz (DE); SINTEF, Trondheim (NO); INTRINSIQ MATERIALS LTD., London (GB)

( * ) Notice: Subject to any disclaimer, the term of this patent is extended or adjusted under 35 U.S.C. 154(b) by 98 days.

(21) Appl. No.: 14/933,951

(22) Filed: Nov. 5, 2015

(65) Prior Publication Data
US 2016/0351529 A1 Dec. 1, 2016

(30) Foreign Application Priority Data

May 26, 2015 (EP) .................................... 15169281

(51) Int. Cl.
*H01L 23/48* (2006.01)
*H01L 23/00* (2006.01)

(52) U.S. Cl.
CPC .............. *H01L 24/81* (2013.01); *H01L 24/03* (2013.01); *H01L 24/08* (2013.01); *H01L 24/11* (2013.01);
(Continued)

(58) Field of Classification Search
CPC ........................................................ H01L 24/81
(Continued)

(56) References Cited

U.S. PATENT DOCUMENTS

2008/0279498 A1* 11/2008 Sampsell ............... G02B 5/284
385/8
2012/0261819 A1* 10/2012 Brunschwiler ....... H01L 21/563
257/738

(Continued)

*Primary Examiner* — Ajay K Arora
(74) *Attorney, Agent, or Firm* — Tutunjian & Bitetto, P.C.; Kurt Goudy

(57) ABSTRACT

A method for electrically coupling a pad and a front face of a pillar, including shaping the front face pillar, the front face having at least partially a convex surface, applying a suspension to the front face or to the pad, wherein the suspension includes a carrier fluid, electrically conducting microparticles and electrically conducting nanoparticles, arranging the front face of the pillar opposite to the pad at a distance such that the carrier fluid bridges at least partially a gap between the front face of the pillar and the pad, evaporating the carrier fluid thereby confining the microparticles and the nanoparticles, and thereby arranging the nanoparticles and the microparticles as percolation paths between the front face of the pillar and the pad, and sintering the arranged nanoparticles for forming metallic bonds at least between the nanoparticles and/or between the nanoparticles and the front face of the pillar or the pad.

13 Claims, 5 Drawing Sheets

(52) U.S. Cl.
CPC .............. *H01L 24/13* (2013.01); *H01L 24/27* (2013.01); *H01L 24/29* (2013.01); *H01L 24/73* (2013.01); *H01L 2224/05647* (2013.01); *H01L 2224/08238* (2013.01); *H01L 2224/13147* (2013.01); *H01L 2224/1607* (2013.01); *H01L 2224/16227* (2013.01); *H01L 2224/2957* (2013.01); *H01L 2224/29647* (2013.01); *H01L 2224/8384* (2013.01)

(58) Field of Classification Search
USPC ........................................................ 257/737
See application file for complete search history.

(56) References Cited

U.S. PATENT DOCUMENTS

2014/0305684 A1* 10/2014 Kang .................. C23C 18/08
174/257
2016/0218057 A1* 7/2016 Lee ..................... H05K 1/112

* cited by examiner

METHOD FOR ELECTRICAL COUPLING AND ELECTRIC COUPLING ARRANGEMENT

BACKGROUND

Technical Field

The invention relates to a method for electrically coupling at least two elements and to a coupling arrangement for electrically coupling to elements.

Related Art

In electronic devices, electric coupling is conventionally implemented, for example, by soldering electric terminals to pads or printed circuitry using a solder material. For example, microelectronic devices are often implemented as semiconductor chips sometimes having bond pads that are placed in regular arrays on the die.

A currently used scheme for conductively coupling bond pads with corresponding contact pads on the substrate is a flip-chip interconnection. A flip-chip package requires bonds of solder that are soldered and form the electrical connection between the chip and the substrate. During the soldering process, the solder needs to be heated above its melting temperature. This process can cause stress to the substrate and/or the semiconductor chip due to differing thermal expansion coefficients.

According to other conventional schemes, conducting pastes, for example containing silver or gold particles, have been printed or stenciled on pads and used as electrical coupling means. Conventionally, such conductive pastes are compressed and eventually sintered to form robust electrical connections.

SUMMARY

According to a first aspect, the invention can be embodied as a method for electrically coupling a pad and a front face of a pillar, including shaping the front face of the pillar having at least partially a convex surface, applying a suspension to the front face of the pillar or to the pad, wherein the suspension includes a carrier fluid, electrically conducting microparticles and electrically conducting nanoparticles; arranging the front face of the pillar opposite to the pad at a distance such that the carrier fluid bridges at least partially a gap between the front face of the pillar or the pad; evaporating the carrier fluid thereby confining the microparticles and the nanoparticles, and thereby arranging the nanoparticles and the microparticles as percolation paths between the front face of the pillar and the pad; and sintering the arranged nanoparticles for forming metallic bonds at least between the nanoparticles and/or between the nanoparticles and the front face of the pillar and the pad.

According to a second aspect, the invention can be embodied as a coupling arrangement. The coupling arrangement may include an electrically conducing pad having a flat surface, an electrically conducting pillar having a front face, the front face being shaped to have at least partially a convex surface, and an electrically conducting connection structure arranged between the flat surface of the pad and the front face of the pillar, wherein the connection structure includes a plurality of microparticles and a plurality of nanoparticles, the microparticles and the nanoparticles being arranged as percolation paths between the front face of the pillar and the pad, wherein metallic bonds are formed at least between the nanoparticles and/or between the nanoparticles and the front face of the pillar or the pad.

BRIEF DESCRIPTION OF THE DRAWINGS

Similar or functionally similar elements in the figures have been allocated the same reference signs if not otherwise indicated.

DETAILED DESCRIPTION OF THE EMBODIMENTS

In this disclosure, embodiments for methods for electrically coupling at least two elements are disclosed. For example, the methods disclosed herein may include coupling a conductive pad on a substrate (first element) with a pillar protruding from a die of a microelectronic chip (second element). Often, a plurality of pads and corresponding pillars are arranged in arrays that are coupled to each other.

Figure 1:
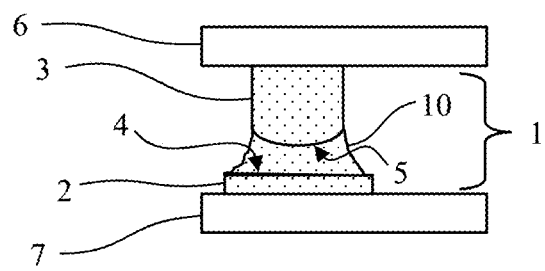
FIG. 1 shows a schematic cross-sectional view of an embodiment of a coupling arrangement.

FIG. 1 shows a schematic cross-sectional view of an embodiment of a coupling arrangement 1 between a chip 6 and a substrate 7. In FIG. 1, an electrically conducting pillar 3 is shown protruding from the chip 6. The pillar 3 has a cylindrical shape and has a front surface 5 facing towards a pad 2. The front surface forms a copula-like surface of the pillar 3. Opposite to the front surface 5 of the pillar 3 is an electrically conducting pad 2 arranged on the substrate 7. The pad 2 has an essentially flat surface 4. In the gap between the front surface 5 of the pillar 3 and the surface 4 of the pad 2, there is an electrically conducting connection structure 10 including pores.

For example, the pillar 3 is made of copper and has a diameter of 10-200 μm. In some embodiments, the diameter is between 10 and 50 μm. The pad 2 placed on the substrate 7 can be made of the same or similar copper material and can have a larger lateral extension than the front surface 5 of the pillar 3. The electric connection structure 10 is formed by percolated paths of nano- and microparticles that are preferably copper nano- and microparticles. As used herein, the term "particles" refers to particles of essentially any shape that can be used for forming the porous structure, when the particles at least partially form metallic bonds with one another. The particles can be small pieces or bits of a solid material. Although the figures show idealized ball-like particles of spherical shape, other geometrical structures for the nanoparticles or microparticles can be contemplated.

The term "microparticles" is used for particles of a first type, and the term "nanoparticles" is used for particles of a second type. Generally, the particles of the first type and the second type differ in their size. The dimensions of particles of the second type (nanoparticles) are chosen such that they may enter reasonably into gaps between attached particles of the first type (microparticles). In some embodiments, a nanoparticle diameter ranges between 10 and 500 nm and is preferably less than one tenth of a diameter of the microparticles ranging, for example between 100 nm and 20 μm.

For example, the gap between the surface 4 of the pad 2 and the front face 5 of the copper pillar 3 is between 5 and 20 μm. The electric connection structure 10 has some porosity, i.e., there are void regions between the copper nano- and microparticles forming the connection 10.

Figure 2:
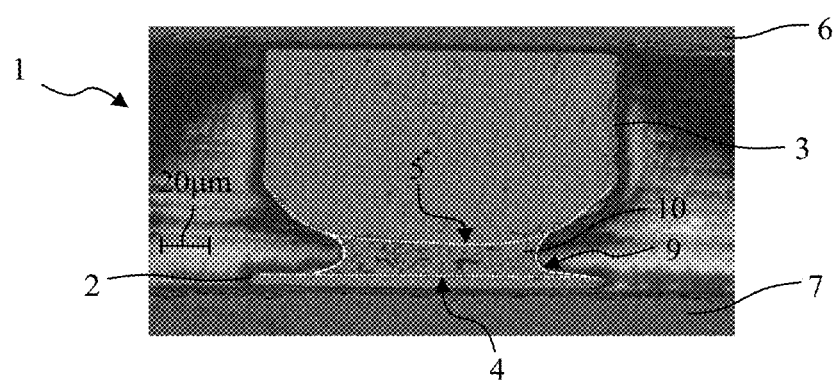
FIG. 2 shows a cross-sectional view of a microscopic image of an embodiment of a coupling arrangement.

FIG. 2 shows a microscopic image of a coupling arrangement 1 that is schematically shown in FIG. 1. FIG. 2 is an electron microscope image of a coupling structure 1 between a chip 6 having an attached copper pillar 3 and a substrate 7 having an attached copper pad 2. The front surface 5 of the copper pillar 3 is indicated by a white dotted line. The front surface 5 exhibits a convex curvature.

The lower essentially flat surface 4 of the pad 2 is indicated by a white dotted horizontal line. The connection structure 10 is a porous material comprising copper nanoparticles and copper microparticles wherein the nanoparticles are at least partially sintered together and form metallic bonds. Metallic bonds can be realized between the material of the copper pillar 3 and the material of the copper pad 2. One can contemplate sintering or annealing the particles.

From the cross-sectional view in FIG. 2, an envelope or meniscus 9 of the connection structure 10 is visible. The meniscus 9 is indicated as a white dashed line. Along the direction from the pad surface 4 to the front face 5 of the pillar 3, the cross-sectional extension of the connection structure 10 decreases towards essentially midway between the two surfaces 4 and 5. The shape of the front face 5 has a partially convex surface. In the embodiments shown in FIGS. 1 and 2, the gap between the (upper) surface 5 of the pillar 3 and the (lower) surface 4 of the pad 2 decreases towards the center of the coupling connection structure 10.

In a manufacturing process for forming the connection structure 10, for example, a dome-shaped front surface 5 of the pillar 3 can be advantageous. This is because during the manufacturing process, the nano- and microparticles are dispersed or suspended in a carrier liquid, that is eventually evaporated. The receding surface of the carrier liquid then constringes the suspended particles and arranges the nano- and microparticles towards the center, where a gap between the surfaces 4 and 5 has its minimum distance. Hence, by shaping, in particular the pillar front surface 5, a high-quality electrical connection can be achieved. In some embodiments, manufacturing the structure 1 does not involve a thermo-compression bonding or thermo-sonic bonding step.

Next, turning to FIGS. 3 to 8, schematic views of structures and arrangements involved in method steps according to embodiments of a method for electrically coupling a pad with a pillar are shown. FIG. 9 shows a flowchart of method steps involved in a method for coupling two elements, for example a pad 2 and a pillar 3. The method according to FIG. 9 can be regarded a manufacturing method for a coupling structure.

Figure 3:
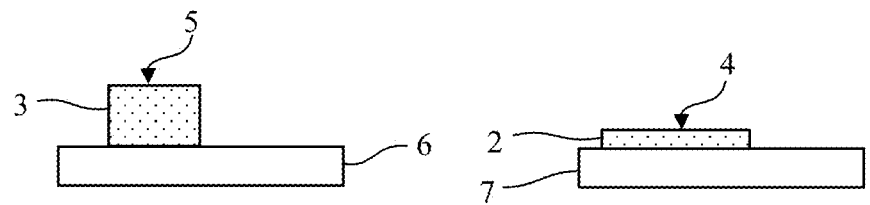
FIG. 3-8 show schematic views of structures and arrangements of method steps according to embodiments of a method for electrically coupling a pad with a pillar.

In a first step S0, an essentially flat pad 2 and an essentially cylindrically shaped pillar 3 is provided. This is, for example, shown in FIG. 3. On the left-hand side, a chip 6 has a protruding pillar 3 with a front face 5. In alternative embodiments, the chip 6 can have a plurality of pillars 3 arranged in an array and each protruding from a surface of the chip. FIG. 3 on the right-hand side shows a substrate 7 that has an essentially flat pad 2 attached. The pad 2 includes a flat surface 4. For example, the pad 2 is made of the same material as the pillar 3.

Figure 4:
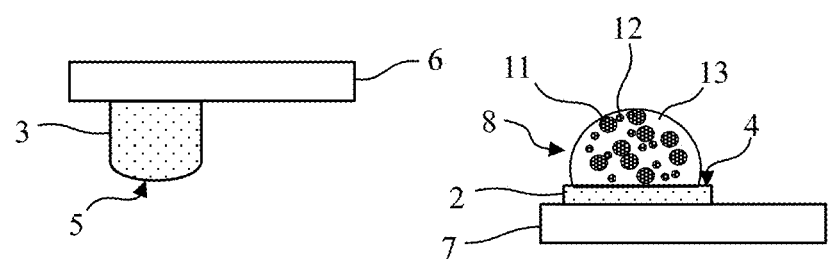

In the next step S1, the front face 5 of the pillar 3 is shaped. This is indicated in FIG. 4, left, where the front face 5 of the pillar 3 is dome-shaped. In FIG. 4, the chip 6 and the pillar 3 are depicted upside down with respect to FIG. 3. In a distal direction from the chip 6, the front face 5 has a convex shape.

Shaping the pillar front face can be included in a manufacturing or growth step of the pillars.

In the next step S2, also shown in FIG. 4, a bi-modal suspension 8 is applied to the pad surface 4. A bimodal suspension 8 is, for example, a bi-modal Copper ink that can be used for printing two-dimensional circuitry. The suspension 8 used in the embodiment of the method, as depicted in FIGS. 3 through 8, comprises a carrier liquid 13, such as, for example, water or a solvent, and at least two types of conducting particles 11, 12. For example, a first type of particles 12 has a first size and a second type 11 of particles has a second size. In particular, the first-type particles 12 are microparticles having an average diameter between 100 nm and 20 μm. The second type of particles 11 may have an average size or diameter between 10 nm and 500 nm.

In FIG. 4, a droplet of a suspension 8 is shown, and in the carrier liquid 13, nano-sized particles 12 and micro-sized particles 11 are shown. Due to the surface tension of the carrier liquid 13, the droplet may adhere to the surface 4 of the pad 2.

In particular, the bi-modal ink, or suspension 8, is a rheological liquid capable of flowing. The suspension 8 can be a colloidal liquid including the particles 11, 12.

In an alternative embodiment, the suspension 8 can also be applied to the front face 5 of the pillar 3.

Figure 5:
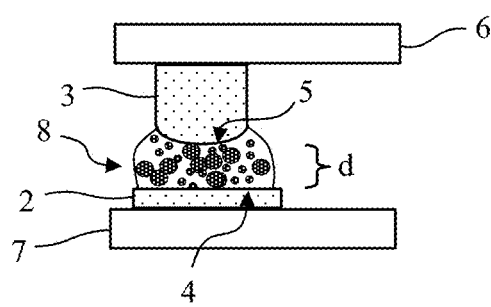

In the next step S3, the pad 2 and the pillar 3 are arranged opposite to one another. This is shown in FIG. 5. The front face 5 of the pillar 3 and surface 4 of the pad 2 are essentially arranged opposite to one another such that the distance d is bridged by the carrier liquid 13 or the suspension 8. Generally, there is no pressure applied between the pad 2 and the pillar 3. This means that the micro- and nanoparticles 11, 12 in the suspension 8 generally float freely.

Figure 6:
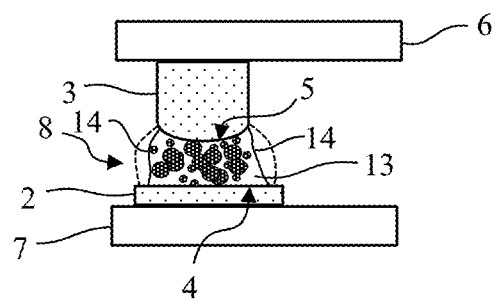

In order to form percolation paths employing the particles 11, 12 between the surface 4 of the pad 2 and the front face 5 of the pillar 3, the carrier liquid 13 is removed by evaporation. This is indicated as step S4 in FIG. 6. When evaporating the carrier liquid 13, the surface 14 of the carrier liquid 13 recedes. The surface tension pushes the particles 11, 12 towards the center of the gap towards a central axis (not shown). In FIG. 6, dashed lines show the position of the surface 14 according to FIG. 5, while the solid lines 14 indicate the receding surface of the carrier liquid.

As a result, the nano- and microparticles 12, 11 are arranged due to capillary forces and form percolation paths. The process of forming bridging arrangements using capillary forces is explained in U.S. Patent Publication No. US2012/0261819A1, which is hereby incorporated by reference.

Figure 7:
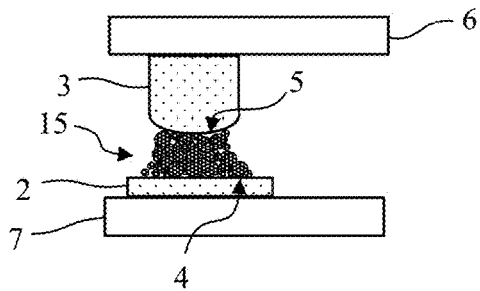

As a result, which is depicted in FIG. 7, a porous structure 15 is formed between the pillar 3 and the pad 2. Because the nano- and microparticles 12, 11 include conducting materials, in particular Copper, as well as the pillar 3 and the pad 2, an electric coupling is already achieved. Preferably, the particles 11, 12, the pad 2 and the pillar 3 are made of the same material, e.g., Copper or a Copper alloy.

In an optional step S5, a sintering process is performed. By sintering, in particular the nano-sized particles 12 form metallic bonds with one another. Nanoparticles may form metallic bonds with the microparticles, and microparticles can form metallic bonds among them. Additionally, nanoparticles 12 can form metallic bonds with the material of the pillar 3 and/or the pad 2. For example, sintering can be performed in a batch oven under formic acid in nitrogen at a temperature between 150 and 200° C. It is an advantage that sintering occurs below the melting point of the material to be sintered. In comparison to conventional soldering technology, temperatures applied to the substrate 7 and the chip 6 in the course of the entire coupling process are much lower than in soldering schemes. Hence, less thermal stress occurs.

In embodiments, the sintering process is performed using formic acid, in particular when the nanoparticle material, the microparticle material, the pad material and the pillar material is Copper or a Copper alloy. Formic acid can reduce Copper oxide on surfaces and particles and facilitates the sintering process. Preferably, during sintering or annealing no additional pressure is applied to the structure, e.g., shown in FIG. 7. Some pressure can occur due to the weight of the upper parts (in the Fig., above the pillar 3).

Figure 8:
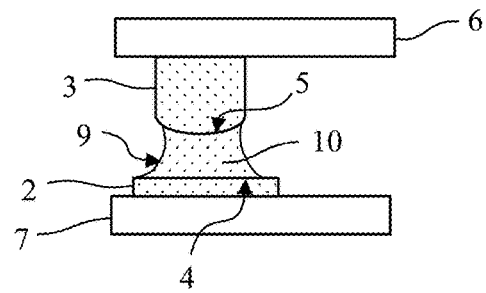
Figure 9:
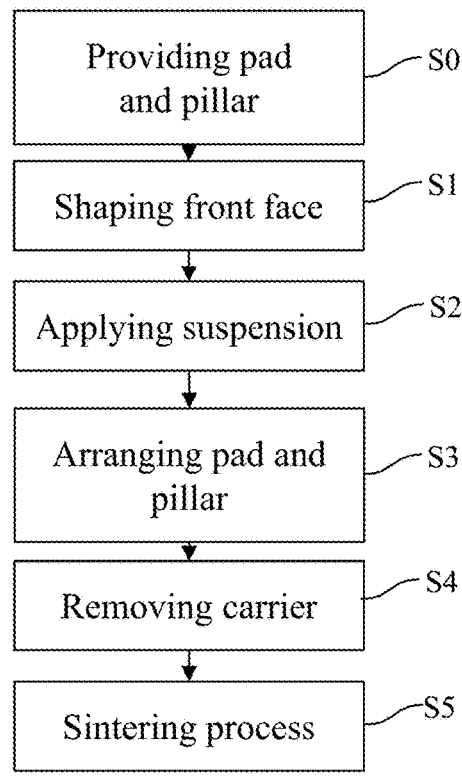
FIG. 9 shows a flow chart for an embodiment of a method for electrically coupling a pad with a pillar.

As a result, as shown in FIG. 8, an electric connection structure 10 is formed between a front face 5 of the pillar 3 and the surface 4 of the pad 2. Due to the manufacturing method, the electric connection structure 10 has a meniscus-shaped form 9 tapered towards the center between the surfaces 4 and 5. This is due to the surface tension of the carrier fluid during evaporation. The electric coupling connection structure 10 has a larger cross-sectional dimension in the vicinity of the pad 2 and in the vicinity of the front face of the pillar 5. Additionally, the connection structure 10 is a porous structure stemming from the different sizes of the microparticles and the nanoparticles.

The shape of the connection structure 10 can be adjusted by the contact angle of the suspension 8 and the copper pillar/pad, e.g., by a functionalization of the copper surface and/or by the choice of surface tension of the solvent or carrier fluid 13.

Figure 10:
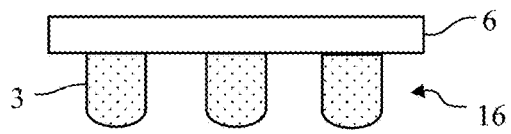
FIG. 10-13 show schematic views of structures and arrangements of method steps according to alternative embodiments of a method for electrically coupling a pad with a pillar.

FIGS. 10 through 13 show schematic views of structures and arrangements involved in alternative method steps that can be executed alternatively or additionally to the ones already depicted. FIG. 10 shows a chip 6 that has a plurality of pillars 3 extending from a surface. The pillars 3 are, for example, arranged in an array 16.

Figure 11:
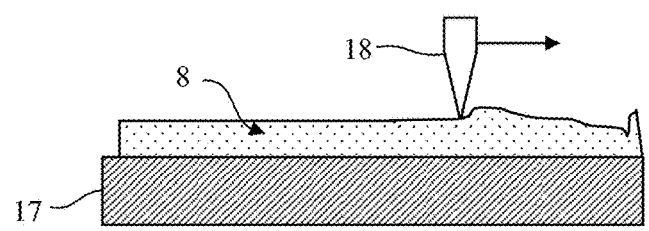

FIG. 11 shows a carrier element 17 having a bi-modal copper ink coating 8 on the upper surface. For example, the carrier 17 can be contemplated as a rotary dipping tray. The bi-modal ink or suspension 8 of micro- and nano-sized particles in a carrier liquid 8 is flattened by a doctor blade 18. The doctor blade 8 is moved towards the right, so that an essentially flat surface of the viscous bi-modal ink 8 is achieved.

Figure 12:
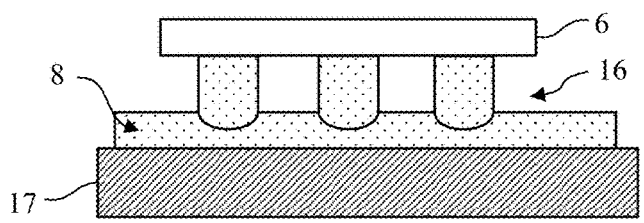

Next, as shown in FIG. 12, the array 16 comprising a plurality of copper pillars 3 is dipped into the ink 8. The rotary dipping tray 17 together with the flattened micro- and nanoparticle ink 8 can be used as a reservoir for placing droplets of the ink material to the front faces of the pillars 3.

Figure 13:
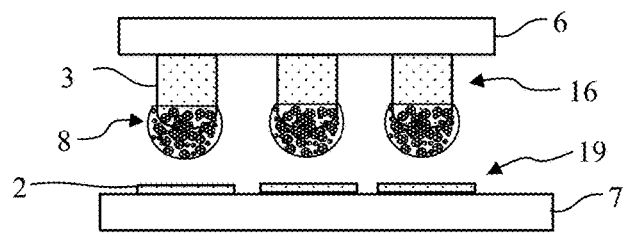

Next, as shown in FIG. 13, droplets of the bi-modal ink 8 are attached to the pillars 3. As explained above, the bi-modal ink 8 can comprise a carrier liquid, micro-sized particles and nano-sized particles that preferably have the same material of the pillars 3 and the pads 2, as shown in FIG. 13 on the substrate 7. The pads 2 are arranged in a similar manner as the array 16 of the pillars 3. For example, there is a corresponding array comprising pads 2 on the substrate 7.

In a next step, which is not explicitly shown, the copper pillars 3 and the pads 2 are brought together such that the gap is bridged by the carrier fluid of the suspension 8. This is essentially shown in FIG. 5 above for a single pillar-pad pair. The dipping process is easy to perform in parallel with a plurality of pad-and-pillar pairs. Hence, dipping the pillars arranged in an array 16, as shown in FIG. 12, into the ink reservoir facilitates and increases the effectiveness of the coupling process. It can be considered an advantage that no masks or printing facilities for applying the ink to the pads or pillars are used.

Figure 14:
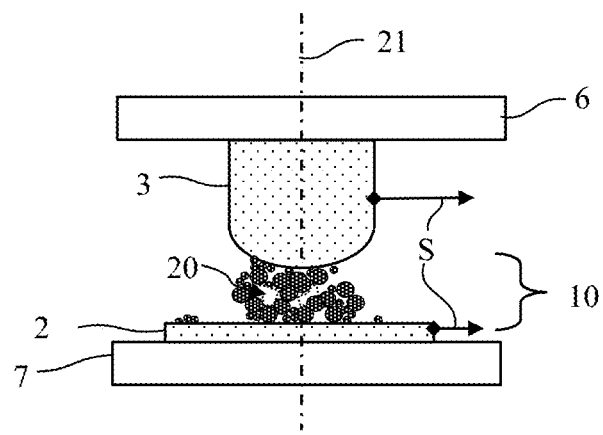
FIG. 14 shows a schematic cross-sectional view of a further embodiment of a coupling arrangement.

FIG. 14 shows a cross-sectional view of a further embodiment of a coupling arrangement. In FIG. 14, a dome-shaped pillar 3 is shown which is coupled to a flat pad 2 by a porous connection structure 10 including sintered nano-sized particles and micro-sized particles that are percolated and form electric coupling paths. In FIG. 14, a center axis 21 is shown as a dashed-dotted line in a vertical direction.

Due to the different sizes and the ratio between the volumetric amounts of nanoparticles in comparison to the microsized particles, void regions 20 can occur. The void regions 20 can be contemplated as pores. As a result, the connection structure is an essentially porous copper material, wherein the pores are voids. Preferably, no other filler materials are included in the connection structure 10.

Due to the porosity that can be specifically implemented by changing the ratio between nano- and micro sized particles in the suspension when manufacturing the structure, a high-quality coupling material can be achieved. The pores in the connection structure 10 may lead to mechanical properties, such as a favorable plasticity. For example, the coupling structure 10 remains robust and essentially intact when shearing forces may occur because of differing thermal extension coefficients of the substrate 7 on the one hand and the thermal expansion of the die 6 on the other hand. This is indicated as different arrows S in FIG. 14. The porous configuration, including two types of metallically bonded particles, can lead to an engineered yielding of the porous interconnect, relaxing the mechanical stress and hence, the robustness of the interconnect and back-end-of-line wiring of the die against shearing forces.

The proposed electric coupling schemes allow for specifically engineering the porosity, e.g., by a particle number ratio of the nano- and microparticles, their diameter-ratio, the volume ratio of particles in the suspension, the viscosity of the carrier liquid, etc. Further, adapting a pressure and/or the annealing temperature and duration of the sintering step may change the porosity of the resulting connection structure 10.

Figure 15:
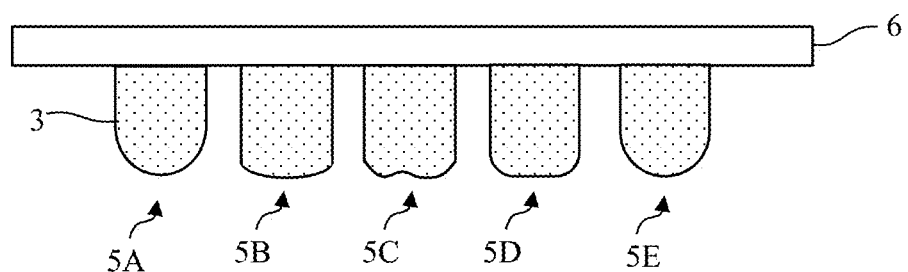
FIG. 15 shows schematic cross-sectional views of embodiments for front-surface shapes of pillars used in embodiments of coupling arrangements.

FIG. 15 shows embodiments for front-surface shapes of pillars 3 that can be used in embodiments of coupling methods, manufacturing methods or coupling arrangements, according to this disclosure.

For example, essentially dome-shaped pillars, as indicated in FIG. 15 as 5A, 5B and 5E, can be contemplated. The curvature of the convex shape can be adapted. However, essentially cylindrical pillars, wherein the edges of the front face are rounded like in 5D, can be also contemplated. Irregular curvatures, as shown in FIG. 15 in pillar 5C, may lead to specific porosity landscapes across the coupling structure that develops during the manufacturing process. This is due to the capillary forces arranging the micro- and nano-sized particles during the process of confining and arranging the particles that eventually form electrically conducting percolation paths.

Alternatively or additionally, a shape of the pad surface 4 can be modified. For example, the pad surface 4 may have a cupola-like or convex shape. Shaping the gap between the pad 2 and the pillar front can lead to a specific energy landscape experienced by the carrier liquid when the surface tension restricts the corresponding envelop towards the center axis.

The shape of the connection structure can be adapted by changing a contact angle between the surface of the suspension and the pad surface or the pillar surface. One can further contemplate of adapting the surface free energy of the pillar and pad and/or the surface tension of the fluid for generating specific geometries or cross-sectional shapes of the interconnect structure. This can be achieved by coating or structuring the surfaces involved.

It can be considered an advantage that no printing or stenciling steps are required in embodiments of the invention.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims. It is understood that the sequence of the method steps is not mandatory. Rather, certain steps can be interchanged or executed contemporaneously.

The invention claimed is:

1. A method for electrically coupling a pad and a front face of a pillar, comprising:
    shaping the front face of the pillar, the front face having at least partially a convex surface;
    applying a suspension to the front face of the pillar or to the pad, wherein the suspension includes a carrier fluid, electrically conducting microparticles suspended within the carrier fluid and electrically conducting nanoparticles suspended within the carrier fluid, wherein the suspension is applied as a droplet that adheres to the front face of the pillar or to the pad with surface tension;
    arranging the front face of the pillar opposite to the pad at a distance such that the carrier fluid bridges at least partially a gap between the front face of the pillar and the pad;
    evaporating the carrier fluid thereby concurrently confining each of the microparticles and the nanoparticles, and thereby concurrently arranging the nanoparticles and the microparticles into percolation paths between the front face of the pillar and the pad; and
    sintering the arranged nanoparticles for forming metallic bonds at least between one of the nanoparticles or between the nanoparticles and the front face of the pillar or the pad.

2. The method of claim 1, wherein no additional pressure over ambient pressure is applied between the front face of the pillar and the pad during evaporating the carrier fluid and sintering the arranged nanoparticles.

3. The method of claim 1, wherein the pad comprises a pad material, the pillar comprises a pillar material, the microparticles comprise a microparticle material, and the nanoparticles comprise a nanoparticle material, wherein the pad material, the pillar material, the nanoparticle material and the microparticle material include Copper.

4. The method of claim 1, wherein the pad, the pillar, the microparticles, and the nanoparticles include a same material.

5. The method of claim 1, wherein applying the suspension comprises dipping the front face of the pillar into a reservoir providing the suspension.

6. The method of claim 1, wherein the suspension is a bi-modal Copper ink.

7. The method of claim 1, wherein the microparticles have a microparticle size and the nanoparticles have a nanoparticle size, and a ratio between the microparticle size and the nanoparticle size is chosen such that during evaporating of the carrier liquid, the nanoparticles can enter void regions between percolated microparticles.

8. The method of claim 7, wherein the microparticle size is at least ten times larger than the nanoparticle size.

9. The method of claim 1, wherein a volume ratio between the nanoparticles and the microparticles is between ten and one hundred in the suspension.

10. The method of claim 1, wherein shaping the front face of the pillar comprises forming a dome-shaped front surface.

11. The method of claim 1, wherein sintering is performed at a temperature lower than a melting temperature of the nanoparticles and the microparticles.

12. The method of claim 1, wherein sintering the nanoparticles comprises providing formic acid.

13. The method of claim 1, further comprising:
    providing a plurality of pads arranged as an array; and
    providing a plurality of pillars arranged as an array, each pillar having a front face;
    wherein the steps of shaping, arranging, applying, evaporating and sintering are contemporaneously performed for a plurality of pad-pillar pairs.

* * * * *